United States Patent [19]

Bryant et al.

[11] Patent Number: 5,300,797
[45] Date of Patent: Apr. 5, 1994

[54] COPLANAR TWIN-WELL INTEGRATED CIRCUIT STRUCTURE

[75] Inventors: Frank R. Bryant, Denton; Tsiu C. Chan, Carrollton; Kuei-Wu Huang, Irving, all of Tex.

[73] Assignee: SGS-Thomson Microelectronics, Inc., Carrollton, Tex.

[21] Appl. No.: 860,980

[22] Filed: Mar. 31, 1992

[51] Int. Cl.$^5$ .............................................. H01L 27/02
[52] U.S. Cl. .................................. 257/206; 257/369; 257/371; 257/374; 257/797; 437/34; 437/63; 437/979
[58] Field of Search ............... 257/371, 797, 204, 206, 257/369, 374, 920; 437/979, 34, 63, 61, 69, 149, 147; 148/DIG. 70, DIG. 163

[56] References Cited

U.S. PATENT DOCUMENTS

| | | | |
|---|---|---|---|
| 4,947,114 | 8/1990 | Schindlbeck | 257/797 X |
| 4,985,746 | 1/1991 | Asahina | 257/371 |
| 5,045,495 | 9/1991 | Teague et al. | 437/70 |

FOREIGN PATENT DOCUMENTS

| | | | |
|---|---|---|---|
| 1135033 | 5/1989 | Japan | 257/797 |
| 3093251 | 4/1991 | Japan | 257/797 |

OTHER PUBLICATIONS

No Author, "Dicing Alignment Targets for Use With Pattern Recognition System", *Research Disclosure*, No. 340, Aug., 1992, Kenneth Mason Publications Ltd., England, Abstract No. 34015.

*Primary Examiner*—William Mintel
*Attorney, Agent, or Firm*—Kenneth C. Hill; Robert Groover; Richard K. Robinson

[57] ABSTRACT

A structure and method is provided for fabricating an integrated circuit having an N-type well and a P-type well, with the upper surfaces of the N-type well and the P-type well coplanar. An insulating layer is formed over the integrated circuit. A first masking layer is formed over the insulating layer to define locations of a first well to be formed. An impurity of a first conductivity type is implanted into the semiconductor substrate of the integrated circuit to form a first region. The first masking layer is removed, and a second masking layer is formed over the insulating layer to define locations of a second well to be formed. An impurity of a second conductivity type is implanted into the semiconductor substrate of the integrated circuit to form a second region. The second masking layer is then removed. The integrated circuit is thermally heated to form the first and second wells in the substrate. If desired, sets of alignment keys may be formed in a semiconductor wafer by first forming a layer of insulating material over a semiconductor wafer, followed by forming a layer of masking material to define the locations of the sets of alignment keys and anisotropically etching into the semiconductor wafer to form the sets of alignment keys.

25 Claims, 2 Drawing Sheets

5,300,797

COPLANAR TWIN-WELL INTEGRATED CIRCUIT STRUCTURE

BACKGROUND OF THE INVENTION

1. Field of the Invention

The present invention relates generally to integrated circuits, and more specifically to a structure and method for fabricating integrated circuits.

2. Description of the Prior Art

Self-aligned twin well formation is a process used during conventional CMOS integrated circuit fabrication. In this process, a barrier layer is used as a mask during implantation of impurities of one conductivity type into a semiconductor substrate. Thermal oxide is formed in the exposed regions of the semiconductor substrate and the barrier layer is then removed. The thermal oxide is used as a mask during implantation of impurities of a second conductivity type. The thermal oxide is removed, and the integrated circuit heated to form the twin wells within the substrate.

As known in the art, formation of the thermal oxide also results in oxidation of a portion of the semiconductor substrate. Consequently, the surface of the semiconductor substrate loses its planarity when the thermal oxide is removed. The upper surface of one well is lower than the upper surface of the other well.

This loss of planarity is a problem during subsequent processing steps, such as the formation of gate electrodes on the surface of the twin wells. Because the surfaces of the twin wells are not coplanar, mask focusing problems occur during patterning of the gate electrodes. This causes the critical dimensions of the gate electrodes to differ. As known in the art, these focusing problems cause numerous problems with the manufactured integrated circuits.

Therefore, it would be desirable to provide a method for forming twin wells in a semiconductor substrate which will have coplanar surfaces. It is also desirable that such a method not significantly increase the complexity of the fabrication process.

According to the present invention, a structure and method is provided for fabricating an integrated circuit having an N-type well and a P-type well, with the upper surfaces of the N-type well and the P-type well coplanar. An insulating layer is formed over the integrated circuit. A first masking layer is formed over the insulating layer to define locations of a first well to be formed. An impurity of a first conductivity type is implanted into the semiconductor substrate of the integrated circuit to form a first region. The first masking layer is removed, and a second masking layer is formed over the insulating layer to define locations of a second well to be formed. An impurity of a second conductivity type is implanted into the semiconductor substrate of the integrated circuit to form a second region. The second masking layer is then removed. The integrated circuit is thermally heated to drive the first and second regions deeper into the substrate to form the first and second wells. If desired, sets of alignment keys may be formed in a semiconductor wafer by first forming a layer of insulating material over a semiconductor wafer, followed by forming a layer of masking material to define the locations of the sets of alignment keys and anisotropically etching into the semiconductor wafer to form the sets of alignment keys. The sets of alignment keys may be formed in a portion of the semiconductor wafer that is not part of a substrate for any particular integrated circuit.

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIG. 1 is a sectional view of an integrated circuit illustrating a prior art structure and method for fabricating integrated circuits; and FIGS. 2-7 are sectional views of an integrated circuit illustrating a preferred structure and method for fabricating integrated circuits according to the present invention.

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing crosssections of portions of an integrated circuit during fabrication are not drawn to scale, but instead are drawn so as to illustrate the important features of the invention.

Figure 1:
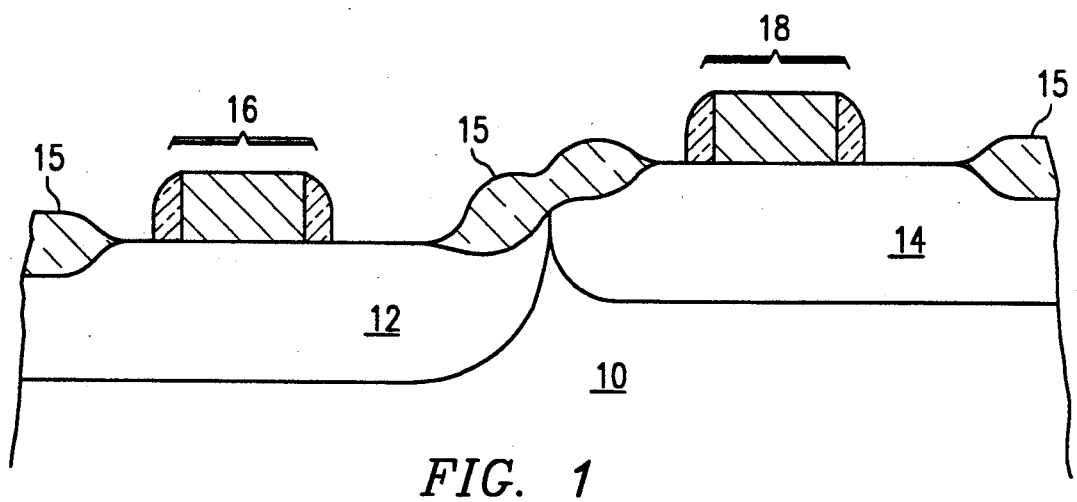

FIG. 1 depicts a sectional view of an integrated circuit illustrating a prior art structure and method for fabricating integrated circuits. An integrated circuit will be built on a semiconductor substrate 10. Impurities have been implanted into the semiconductor substrate 10 to form an N-type well 12 and a P-type well 14. Generally, the twin wells are formed using a patterned nitride layer to mask the P-type well during implantation of the N-type impurity (not shown). An oxide layer is then grown on the exposed portions of the semiconductor substrate 10, and is used as a mask during implantation of the P-type impurity for the P-type well (not shown).

Those skilled in the art will recognize that formation of the thermal oxide also results in oxidation of a portion of the semiconductor substrate 10. Thus, the surface of the semiconductor substrate 10 losses its planarity. After the thermal oxide is removed, the surface of the N-type well is lower than the surface of the P-type well. This loss of planarity is a problem during subsequent processing steps, as described below.

A region of field oxide 15 is formed between and within portions of the N-type 12 and P-type 14 wells. The region of field oxide 15 can be formed using local oxidation of silicon, or other techniques known in the art. Gate electrode 16 is then formed on the surface of the N-type well 12. Gate electrode 18 is formed on the surface of the P-type well 14. Because the surface is non-planar mask focusing problems arise. Typically, the depth of focus of the optical system is reduced significantly by the difference in height between gate electrodes 16, 18. Therefore, it is not possible to properly focus the mask to accurately expose the photoresist layer at both locations for gate electrodes 16, 18. This causes the critical dimensions to differ, and gate electrodes 16, 18 to deviate from the desired pattern as defined by the mask.

Figure 2:
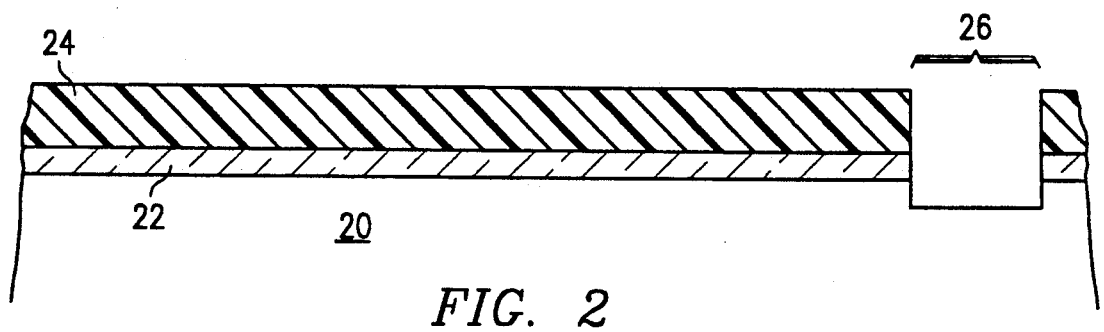

FIGS. 2-7 are sectional views of an integrated circuit illustrating a preferred structure and method for fabricating integrated circuits according to the present invention. Referring to FIG. 2, a layer of insulating material 22 may be formed on a semiconductor wafer 20. The layer of insulating material 22 is typically made of thermal oxide. Those skilled in the art will recognize that forming the layer of insulating material 22 is optional. A layer of masking material 24 is deposited over the integrated circuit and patterned to define the location of sets of alignment keys 26.

an anisotropic etch is performed to form the sets alignment keys 26 in the semiconductor wafer 20. The sets of alignment keys 26 can be formed on a portion of the semiconductor wafer 20 that will not be part of a substrate for any particular integrated circuit. If desired, the sets of alignment keys 26 can be formed on a portion of the semiconductor wafer 20 that is used for integrated circuits. The layer of masking material 24 and the layer of insulating material 22 are then removed.

Figure 3:
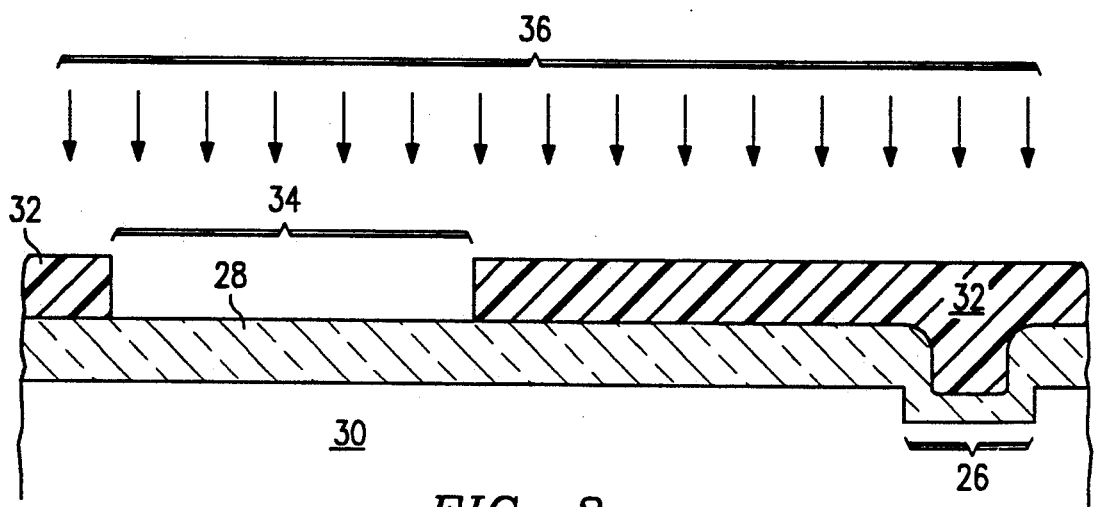

FIG. 3 illustrates the integrated circuit after an insulating layer 28, typically thermal oxide, is formed over the semiconductor substrate 30 of the integrated circuit. The insulating layer 28 is approximately 650 angstroms thick. A first masking layer 32 is deposited over the insulating layer 28, and patterned to define locations 34 of the first well. The first masking layer 32 is preferably a photoresist, and the mask used to expose the first masking layer 32 can be aligned with the sets of alignment keys 26 before exposure. N-type impurities 36 are then implanted into the semiconductor substrate 30 to form a first region. In the preferred embodiment, the N-type impurities 36 are phosphorus, but other materials can be used.

Figure 4:
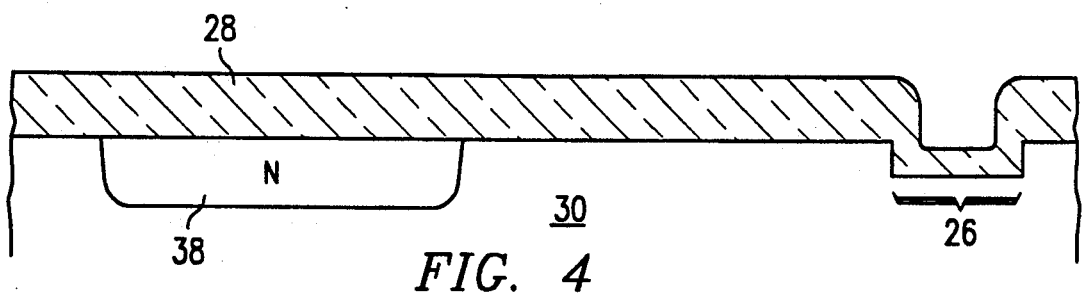

Referring to FIG. 4, the first masking layer 32 is removed. The N-type region 38 is shown in the semiconductor substrate 30.

Figure 5:
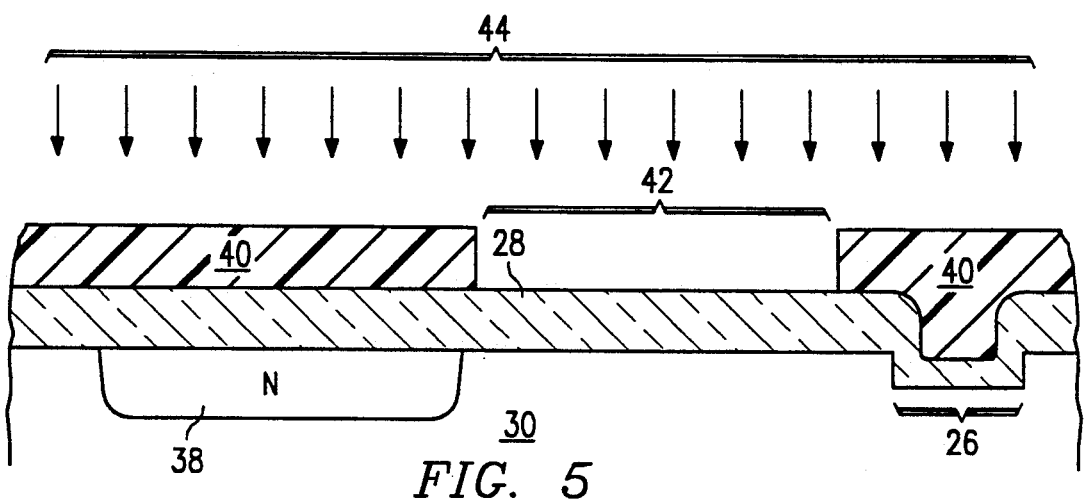

FIG. 5 illustrates the integrated circuit after a second masking layer 40 is deposited over the insulating layer 28 and patterned to define locations 42 of a second well. The second masking layer 40 is preferably a photoresist, and the mask used to expose the second masking layer 40 can be aligned with the sets of alignment keys 26 before exposure. P-type impurities 44 are implanted into the semiconductor substrate 30 to form a second region. In the preferred embodiment, the P-type impurities 44 are boron, but other materials can be used.

Figure 6:
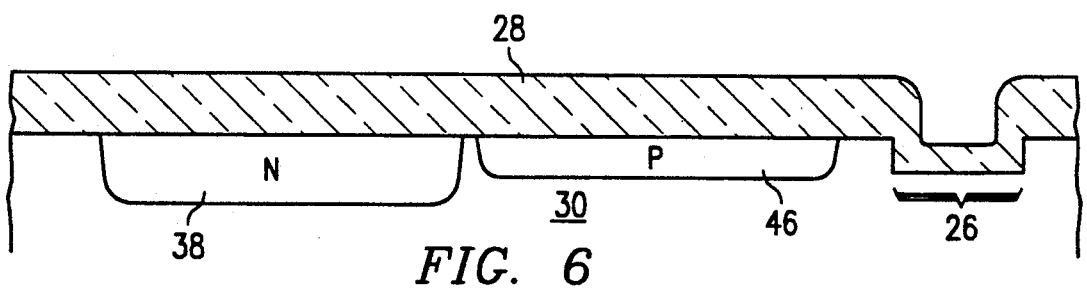

Referring to FIG. 6, the second masking layer 40 is removed. The N-type region 38 and the P-type region 46 are shown in the semiconductor substrate 30. The integrated circuit is then thermally heated to form a N-type well and a P-type well in the semiconductor substrate 30. Those skilled in the art will recognize that the sequence described above concerning the formation of the N-type well and the P-type well is not critical, and can be switched.

Figure 7:
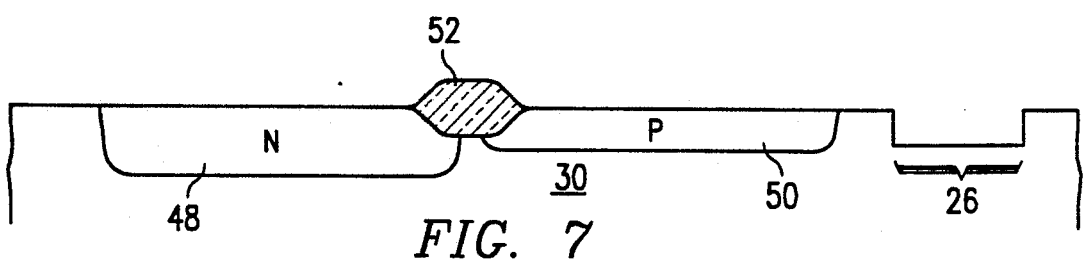

FIG. 7 illustrates the integrated circuit after a region of field oxide 52 is formed between and within portions of the N-type 48 and P-type 50 wells. The region of field oxide 52 can be formed using local oxidation of silicon, or other techniques known in the art. The integrated circuit is ready for further processing steps.

The present invention provides a method for fabricating integrated circuits having coplanar twin wells. This minimizes exposure focusing problems. Additionally, the planarity of the integrated circuit will be improved, thus alleviating step coverage problems. If the technique used to form the region of field oxide is one that results in a relatively planar region of field oxide, the surface of the integrated circuit is very flat prior to formation of gates and gate oxides.

Forming sets of alignment keys provide for easy alignment. As known in the art, keys of various shapes and sizes can be used, and alignment is made on the edges of the excavated area. Thus, the loss of edge definition between the N-type well and the P-type well is not harmful.

While the invention has been particularly shown and described with reference to a preferred embodiment, it will be understood by those skilled in the art that various changes in form and detail may be made therein without departing from the spirit and scope of the invention.

What is claimed is:

1. A structure in an integrated circuit, comprising:
   an N-type well in a semiconductor substrate;
   a P-type well in the semiconductor substrate, wherein the upper surface of the N-well and P-well are coplanar.

2. The structure of claim 1, further comprising sets of alignment keys formed in a semiconductor wafer.

3. The structure of claim 2, wherein the sets of alignment keys are formed in a portion of the semiconductor wafer that is not part of the integrated circuit.

4. The structure of claim 1, further comprising a region of field oxide between the N-type well and the P-type well.

5. The structure of claim 1, further comprising a plurality of active device regions within respective ones of said wells, said active device regions being separated by oxide isolation regions.

6. The structure of claim 1, further comprising a plurality of active device regions within respective ones of said wells, said active device regions being separated by oxide isolation regions, said oxide isolation regions being recessed into said first surface to produce an approximately planar structure.

7. The structure of claim 1, further comprising a plurality of active device regions within respective ones of said wells, said active device regions being separated by oxide isolation regions, and said oxide isolation regions overlying boundaries between wells of dissimilar conductivity type.

8. An integrated circuit structure, comprising:
   a substrate comprising monolithic semiconductor material of a first conductivity at a first surface thereof;
   a plurality of first well regions, each comprising a diffusion of first-conductivity-type dopant into said semiconductor material, to produce a higher dopant concentration than that of other portions of said semiconductor material;
   a plurality of second well regions, each comprising a second-conductivity-type diffusion within said semiconductor material;
   a first plurality of field-effect transistors, each comprising source and drain diffusions of second-conductivity-type dopants at said first surface within a respective one of said first well regions, and a respective gate capacitively coupled to said first surface to define a controllably conductive path between said source and drain regions;
   a second plurality of field-effect transistors, each comprising source and drain diffusions of first-conductivity-type dopants at said first surface within a respective one of said second well regions, and a respective gate capacitively coupled to said first surface to define a controllably conductive path between said source and drain regions;
wherein said first surface over said first well regions is coplanar with first surface over said second regions.

9. An integrated circuit structure of claim 8, wherein some portions of said first surface are not part of said first wells nor of said second wells.

10. An integrated circuit structure of claim 8, wherein said first conductivity type is P-type.

11. An integrated circuit structure of claim 8, further comprising a plurality of active device regions within respective ones of said wells, said active device regions being separated by oxide isolation regions.

12. An integrated circuit structure of claim 8, further comprising a plurality of active device regions within respective ones of said wells, said active device regions being separated by oxide isolation regions, said oxide isolation regions being recessed into said first surface to produce an approximately planar structure.

13. An integrated circuit structure of claim 8, further comprising a plurality of active device regions within respective ones of said wells, said active device regions being separated by oxide isolation regions, and said oxide isolation regions overlying boundaries between wells of dissimilar conductivity type.

14. An integrated circuit structure of claim 8, further comprising a plurality of active device regions within each said wells, said active device regions being separated by oxide isolation regions.

15. An integrated circuit structure of claim 8, wherein said first conductivity type is P-type.

16. An integrated circuit structure, unseparated in a wafer form, comprising:
a substrate comprising monolithic semiconductor material of a first conductivity at a first surface thereof;
a plurality of first well regions, each comprising a diffusion of first-conductivity-type dopant into said semiconductor material, to produce a higher dopant concentration than that of other portions of said semiconductor material;
a plurality of second well regions, each comprising a second-conductivity-type diffusion within said semiconductor material;
a first plurality of field-effect transistors, each comprising source and drain diffusions of second-conductivity-type dopants at said first surface within a respective one of said first well regions, and a respective gate capacitively coupled to said first surface to define a controllably conductive path between said source and drain regions;
a second plurality of field-effect transistors, each comprising source and drain diffusions of first-conductivity-type dopants at said first surface within a respective one of said second well regions, and a respective gate capacitively coupled to said first surface to define a controllably conductive path between said source and drain regions;
a plurality of alignment keys, each comprising a recess etched into said first surface;
wherein said first surface over said first well regions is coplanar with said first surface over said second regions.

17. An integrated circuit structure of claim 16, wherein said alignment keys are outside of both said first and second wells.

18. An integrated circuit structure of claim 16, wherein said alignment keys are outside of both said first and second wells.

19. The integrated circuit structure of claim 16, wherein some portions of said first surface are not part of said first wells nor of said second wells.

20. The integrated circuit structure of claim 16, wherein said first conductivity type is P-type.

21. The integrated circuit structure of claim 16, further comprising a plurality of active device regions within respective ones of said wells, said active device regions being separated by oxide isolation regions.

22. The integrated circuit structure of claim 16, further comprising a plurality of active device regions within respective ones of said wells, said active device regions being separated by oxide isolation regions, said oxide isolation regions being recessed into said first surface to produce an approximately planar structure.

23. The integrated circuit structure of claim 16, further comprising a plurality of active device regions within respective ones of said wells, said active device regions being separated by oxide isolation regions, said oxide isolation regions overlying boundaries between wells of dissimilar conductivity type.

24. The integrated circuit structure of claim 16, further comprising a plurality of active device regions within each said wells, said active device regions being separated by oxide isolation regions.

25. The integrated circuit structure of claim 16, wherein said first conductivity type is P-type.

* * * * *